(12) United States Patent
Visser et al.

(10) Patent No.: US 10,608,152 B2
(45) Date of Patent: Mar. 31, 2020

(54) ELECTRO-OPTICAL ASSEMBLY

(71) Applicant: CATI B.V., Helmond (NL)

(72) Inventors: Jurjen Hilwert Visser, Helmond (NL); Erik Peter Veninga, Helmond (NL)

(73) Assignee: CATI B.V., Helmond (NL)

( * ) Notice: Subject to any disclaimer, the term of this patent is extended or adjusted under 35 U.S.C. 154(b) by 0 days.

(21) Appl. No.: 15/781,580

(22) PCT Filed: Dec. 15, 2016

(86) PCT No.: PCT/NL2016/050876
§ 371 (c)(1),
(2) Date: Jun. 5, 2018

(87) PCT Pub. No.: WO2017/105233
PCT Pub. Date: Jun. 22, 2017

(65) Prior Publication Data
US 2019/0097104 A1 Mar. 28, 2019

(30) Foreign Application Priority Data

Dec. 17, 2015 (NL) ...................................... 2015982

(51) Int. Cl.
*H01L 51/00* (2006.01)
*H01L 33/60* (2010.01)
(Continued)

(52) U.S. Cl.
CPC .............. *H01L 33/60* (2013.01); *H01L 33/46* (2013.01); *H01L 33/486* (2013.01);
(Continued)

(58) Field of Classification Search
None
See application file for complete search history.

(56) References Cited

U.S. PATENT DOCUMENTS 3,371,287 A 2/1968 Haddad
8,896,078 B2 * 11/2014 Kam ...................... H01L 33/58
257/432

(Continued)

FOREIGN PATENT DOCUMENTS

JP 2012156214 A 8/2012

OTHER PUBLICATIONS

International Search Report and Written Opinion of the International Searching Authority issued in PCT/NL2016/050876, dated Feb. 2, 2017; ISA/EPO.

*Primary Examiner* — Hung K Vu
(74) *Attorney, Agent, or Firm* — The Roy Gross Law Firm, LLC; Roy Gross

(57) ABSTRACT

According to an aspect of the invention, there is provided an electro-optical device comprising: an electro-optical element having electric terminals and a support for supporting said electro-optical element, said support comprising a substrate, at least an electrode for electrical connection to an electric terminal of the electro-optical element, and a reflective member, said reflective member being disposed on the substrate surface over a perimeter of the electro-optical element, so as to reflect electromagnetic radiation to or from the electro-optical element via said reflective member when in use. The reflective member is contained in a recess provided in or on the substrate surface having a transparent cover covering said recess. The reflective member is formed of a metal that is in liquid state when in use. Advantages may include improved reflective properties and less optical degradation.

15 Claims, 6 Drawing Sheets

(51) Int. Cl.
*H01L 33/62* (2010.01)
*H01L 33/46* (2010.01)
*H01L 33/48* (2010.01)
*H01L 33/50* (2010.01)
*H01L 33/52* (2010.01)
*H01L 51/52* (2006.01)
*H01L 51/56* (2006.01)
*H01L 33/40* (2010.01)

(52) U.S. Cl.
CPC ............ *H01L 33/507* (2013.01); *H01L 33/52* (2013.01); *H01L 33/62* (2013.01); *H01L 51/5203* (2013.01); *H01L 51/5253* (2013.01); *H01L 51/5271* (2013.01); *H01L 51/56* (2013.01); *H01L 33/405* (2013.01); *H01L 2224/16225* (2013.01); *H01L 2224/48091* (2013.01); *H01L 2224/73257* (2013.01); *H01L 2251/5338* (2013.01); *H01L 2251/5361* (2013.01); *H01L 2933/005* (2013.01); *H01L 2933/0058* (2013.01); *H01L 2933/0066* (2013.01)

(56) References Cited

U.S. PATENT DOCUMENTS

| | | | |
|---|---|---|---|
| 2006/0066224 A1* | 3/2006 | Ito | H01L 51/102 |
| | | | 313/504 |
| 2009/0273083 A1 | 11/2009 | Sauciuc et al. | |
| 2009/0273931 A1* | 11/2009 | Ito | G02B 6/0018 |
| | | | 362/267 |
| 2011/0114989 A1* | 5/2011 | Suehiro | H01L 24/97 |
| | | | 257/99 |
| 2013/0214298 A1* | 8/2013 | Lin | H01L 33/60 |
| | | | 257/88 |
| 2013/0294471 A1* | 11/2013 | Palaniswamy | H01L 33/486 |
| | | | 372/43.01 |
| 2015/0147896 A1 | 5/2015 | Ju | |

* cited by examiner

ELECTRO-OPTICAL ASSEMBLY

FIELD OF THE INVENTION

The invention relates to the field of manufacturing a LED package for lighting arrangements and luminaires.

BACKGROUND OF THE INVENTION

In the prior art it is known to electrically connect a LED chip device to a substrate via an interconnection technique, for instance, solder bumps for flip-chips. The substrate has wiring to power the chip device, e.g. via copper wiring, vias etc. The LED device is packaged by means of a transparent resin, that provides an optical housing and protection for the LED, that can be electrically connected via electrical connectors. For optimizing the light output it is known, to provide the substrate with a reflective layer, that reflects light emitted from the LED chip device and enhances the out coupling of light out of the device. For these purposes a silver layer is usually provided. However, there are some problems with this material, which suffers from optical degradation due to silver migration and or sulphide forming etc. Also, it is a challenge to provide reflectivity for the lower wavelengths, for silver at 500 nm and lower. In addition, the material costs and process steps of current led packages are still substantial and the operational life is limited due to thermo-mechanical stresses that are induced by the bonding processes. Alternatively electric wiring is attached to the upper electrode parts of the chip (in contrast to the flip-chip technique), further giving rise to complications. In addition, there is a risk that the light extraction efficiency of light-emitting devices may be decreased by the absorption of light by such exposed portions of the wiring and electrodes.

For both variants, it is an object to provide a low cost alternative for the reflector forming, that does not suffer from the afore mentioned degradation and keeps reflective values at optimal level. Also it is an object to provide a package that has a reliable, low temperature bonding process and reduced thermo-mechanical stresses during fabrication and operational life.

JP2012-156214A discloses a light-emitting device which includes a light-emitting element that is flip-chip mounted on a substrate having a wiring, the light-emitting device being characterized in that it has an insulating light-reflecting layer disposed on the wiring and has a bump which penetrates through the insulating light-reflecting layer to reach the wiring and thereby connects the light-emitting element to the wiring.

SUMMARY OF THE INVENTION

According to an aspect of the invention, there is provided an electro-optical assembly comprising: at least one electro-optical element having electric terminals and a support for supporting said electro-optical element, said support comprising a substrate, at least an electrode for electrical connection to an electric terminal of the electro-optical element, and a reflective member, said reflective member being disposed on the substrate surface in optical correspondence with the electro-optical element, so as to reflect electromagnetic radiation to or from the electro-optical element via said reflective member when in use. The reflective member is contained in a recess provided in or on the substrate surface having a transparent cover covering said recess. The reflective member is formed of a metal that is in liquid state when in use. Advantages may include improved reflective properties and less optical degradation. The recess may be designed by controlling the geometry of the cover or the substrate, so that the recess is formed by encapsulation of the reflective member when deposited. Alternatively the recess may be specifically designed, and the reflective member may be inserted into the so formed recess in solid or liquid state.

According to a further aspect of the invention, there is provided a process for manufacturing an electro-optical device, the process comprising: a step of providing a support including a substrate and an electro-optical element having one or more electric terminals; a step of providing an electrode on said substrate for electrical connection to one of said terminals of the electro-optical element, a step of disposing a reflective member on the substrate surface in a recess provided in or on the substrate surface, a step of placing the electro-optical element relative to the reflective member so as to reflect electromagnetic radiation to or from the electro-optical element via said reflective member when in use; wherein the reflective member is formed of a metal that is in liquid state when in use; and a step of providing a transparent cover covering said recess, said recess containing the reflective member.

Advantages may include improved reflective properties and less optical degradation. Further advantages may include reduction of the number of process steps and providing less breakdown risk in the manufacturing process and operational life due to better thermo-mechanical stress management of chip die connects.

DETAILED DESCRIPTION OF EMBODIMENTS

Figure 1:
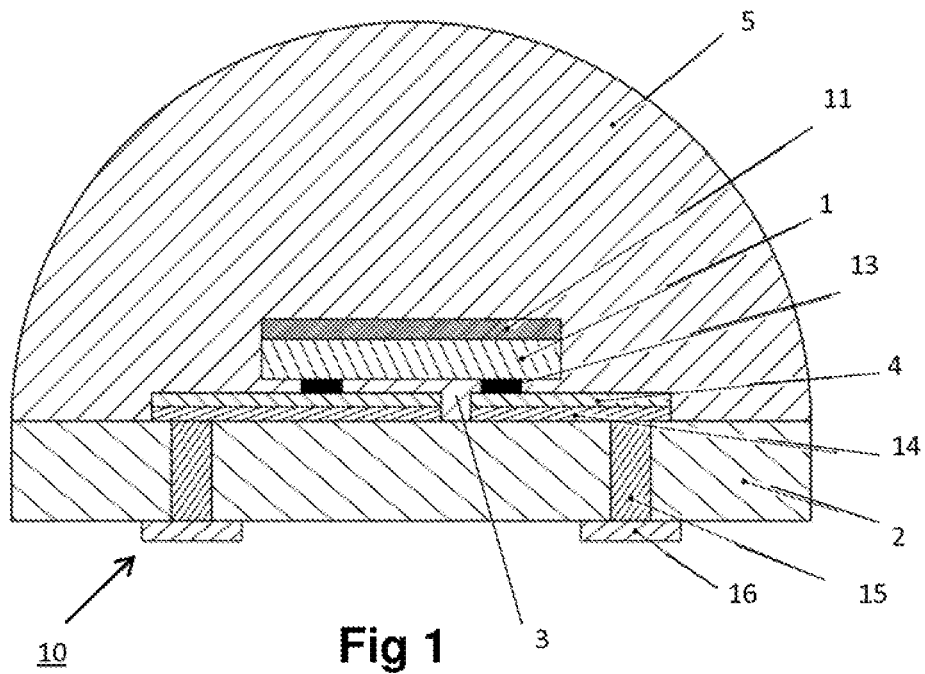
FIG. 1 shows a schematic cross sectional view of a first embodiment according to the invention.

Unless otherwise defined, all terms (including technical and scientific terms) used herein have the same meaning as commonly understood by one of ordinary skill in the art to which this invention belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some instances, detailed descriptions of well-known devices and methods may be omitted so as not to obscure the description of the present systems and methods. The term "and/or" includes any and all combinations of one or more of the associated listed items. It will be further understood that the terms "comprises" and/or "comprising" specify the presence of stated features but do not preclude the presence or addition of one or more other features. All publications, patent applications, patents, and other references mentioned herein are incorporated by reference in their entirety. In case of conflict, the present specification, including definitions, will control.

Throughout the application, any means for providing a mirror in an electro-optical assembly, which may be a LED, OLED or electro-optical conversion diode, such as a solar cell that is liquid in use may be suitable for carrying out the invention, in particular, as further clarified below. The function of the mirror is to extract and guide light out of the assembly and establish electrical interconnects between the LED chip(s) and a substrate. The mirror is established by using a liquid/material in a liquid state (e.g. liquid metal) with both electrically conductive and reflective properties (e.g. an eutectic mixture comprising Gallium and/or Indium) or another metallic mixture with a property of becoming liquid when in use, e.g. with a melting temperature of about 80 degrees Celsius or lower. In use, a mirror is formed in a recess by a meniscus formed by the liquid. The invention provides a low temperature chip bonding method for a variety of led packaging solutions ranging from substrate less packaging to direct chip assembly on luminaire.

The concept may provide solutions for the following led packaging issues;
  Optical degradation silver mirror (e.g. silver migration, silver sulfide forming)
  Decreased and varying thermal interface performance (e.g. die attach voiding)
  Chip size limitation and geometrical limitations due to thermo mechanical stresses
  drop in reflectivity at lower wavelengths. (e.g. silver at 500 nm and lower)
  High packaging costs, due to materials and process steps.
  Not designed for disassembly and recycling.

Further advantages of this concept may be;
  Low Cost due to reduction in the number of parts and process steps.
  Improved reliability, due to the reduced number of parts, a low temperature bonding process and lower thermo-mechanical stresses during operational life and manufacturing.
  Shift forward of the Customer order decoupling point (CODP), use of bare die instead of packaged chips.
  Chip on luminaire (COL) possible due to the low temperature bonding process.
  Elimination of supply chain steps.
  Freedom of shape and size and flexibility of chip and package.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The description of the exemplary embodiments is intended to be read in connection with the accompanying drawings, which are to be considered part of the entire written description. In the drawings, the size and relative sizes of systems, components, layers, and regions may be exaggerated for clarity. Embodiments are described with reference to schematic illustrations of possibly idealized and/or intermediate structures of the invention.

Now referring to FIG. 1, there is shown a schematic cross sectional view of a first embodiment according to the invention. In more detail, a packaged light emitting diode (LED) assembly 10 is depicted having a single or multiple LED chip 1. The LED comprises a photo-emitting layer 11 (further including e.g. photoconversion layer, such as a phosphorous layer) on a die 1, mounted via bumps 13 forming electric terminals on a substrate 2. Many alternatives are possible here. The assembly 10 is sealed as a package by a transparent cover member 5 that fully covers said electro-optical element 1. The electro-optical element 1, in particular a flip chip LED die is connected via said bumps 13 to an electrode 14 for electrical connection to an electric terminal 13 of the electro-optical element 1. A reflective member 4 is disposed on the substrate surface. The reflector 4 covers a substantial portion of the surface, in particular, surrounding the electro-optical element over at least a perimeter. Electromagnetic radiation can thus be reflected to or from the electro-optical element via said reflective member 4 when in use.

The flip-chip 1 is connected to electrode 14 is disposed on an upper surface of the substrate 2 facing the bottom of said electro-optical device 1.

In FIG. 1, the electrode 14 is formed by strip, e.g. copper lying at least partially underneath the reflector layer 4. The metal strip is in contact with a via structure 15, that is provided traversing the substrate 2 in a conventional way. On the bottom side, i.e. opposite the LED 1, contact pads 16 are formed. In this embodiment the reflective member 4 is formed of a metal that is in liquid state when in use. The advantage is that the mirror is self healing. And small contaminations, may be easily absorbed by the metal liquid, while keeping the meniscus in ideal form. Thus, the reflective properties are enhanced. In preferred embodiments, the reflective properties of the mirror 4 can be further enhanced by selecting suitable metals. E.g. Eutectic Gallium Indium mixture has better reflective properties than conventional silver layers for wavelengths below 500 nm.

Further in this embodiment, the reflective member is in electrical contact with the electrode(s) and with said electric terminals. In this way, a known way for providing improved electrical contact is combined with the mirror function of the liquid metal. Furthermore, in this embodiment, the recesses that house the liquid metal are separated via an upstanding barrier that electrically separates one or more recesses on the substrate surface containing said reflective member parts, the reflective member parts in corresponding electrical connection with two or more of electrodes. This barrier can be omitted if only a single electrical contact is provided. E.g. by a further connection not provided via the mirror layer 4 (see below).

Figure 2:
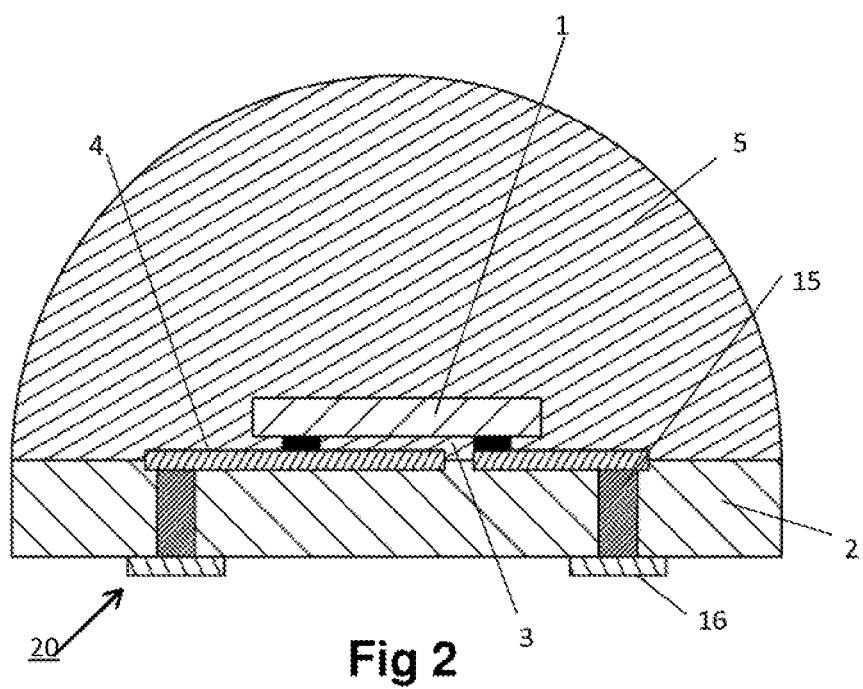
FIG. 2 shows a schematic cross sectional view of a second embodiment according to the invention.

FIG. 2 shows an alternative embodiment wherein further improvements are provided by omitting the conventional strip electrode. In this embodiment, the liquid mirror 4 can be in direct contact with the via structure 15. The phosphorous layer is omitted from the die 1, but phosphorous materials can be added to the cover 5, sealing a compartment that houses liquid mirror 4.

Figure 3:
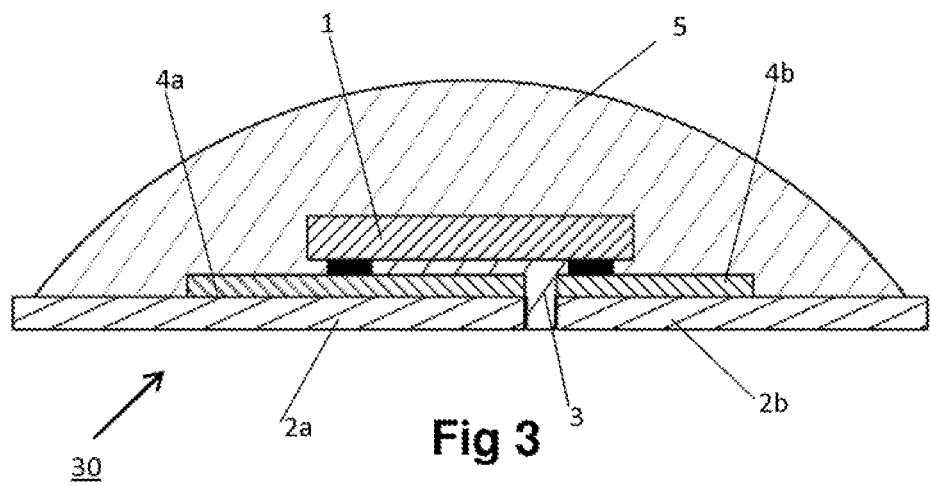
FIG. 3 shows a schematic cross sectional view of a third embodiment according to the invention.

FIG. 3 shows a further alternative, in contrast to the previous examples, wherein the substrate is conductive, e.g. forms at least an electrode in electrical connection with the die 1. In this example a substrate of a conventional strip electrode portions 2a, 2b that forms the interconnection between the die 1 and an appropriate metallization containing a chemically stable barrier and wetting layer, e.g. a Cu strip having a Ni barrier layer and an Au layer defining the wetting properties for the liquid mirror. The portions 2a and 2b are in direct electrical connection with corresponding liquid mirror portions 4a, 4b provided in corresponding recesses between cover 5 and adjacent the substrate portions 2a, 2b. The mirror portions are electrically separated by barrier 3 that likewise separates substrate portions 2a, 2b.

Figure 4:
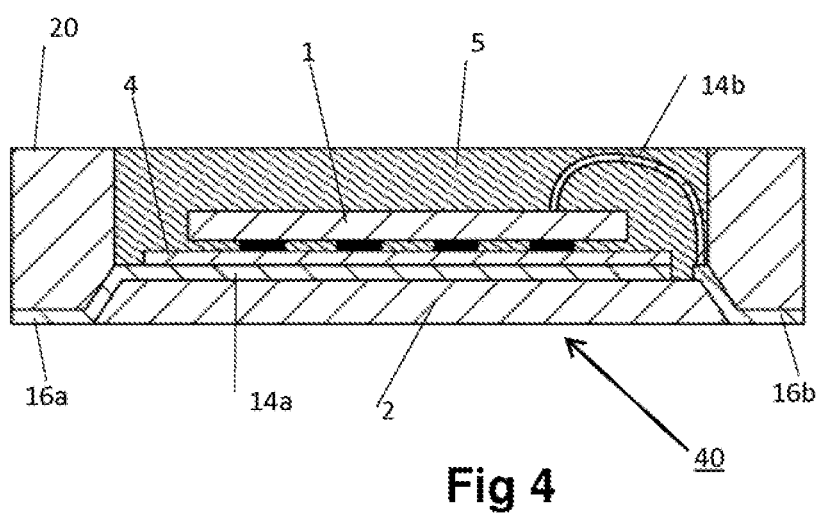
FIG. 4 shows a schematic cross sectional view of a fourth embodiment according to the invention.

FIG. 4 shows an embodiment wherein an electrode 14a is provided in electrical contact with a single reflective member 4, and the other electrode 14b is connected via a top surface wirebond on the LED 1. The assembly 40 is contained in a housing formed by substrate 2, upstanding walls 20 and transparent cover member 5.

Figure 5:
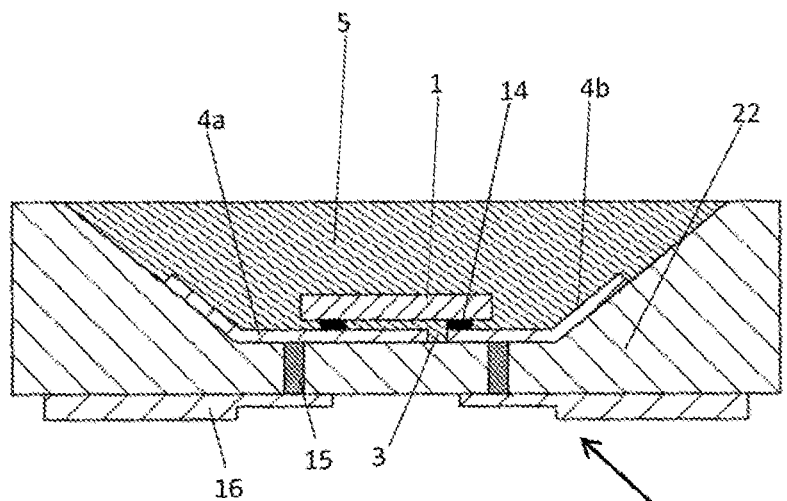
FIG. 5, show a schematic cross sectional view of a fifth embodiment according to the invention.

FIG. 5 shows a package 50, wherein a LED assembly is provided with a diffusive cover 5 covering the LED 1. The LED has bumps 14 in direct electrical contact with respective mirror portions 4a, 4b, that are contained in recesses between the substrate portion 22 and the cover 5. The mirror portions 4a, 4b are in conductive contact with via structure and external contact pads. A barrier 3 electrically separates two or more recesses on the substrate surface containing said reflective member parts 4a, 4b.

Figure 6:
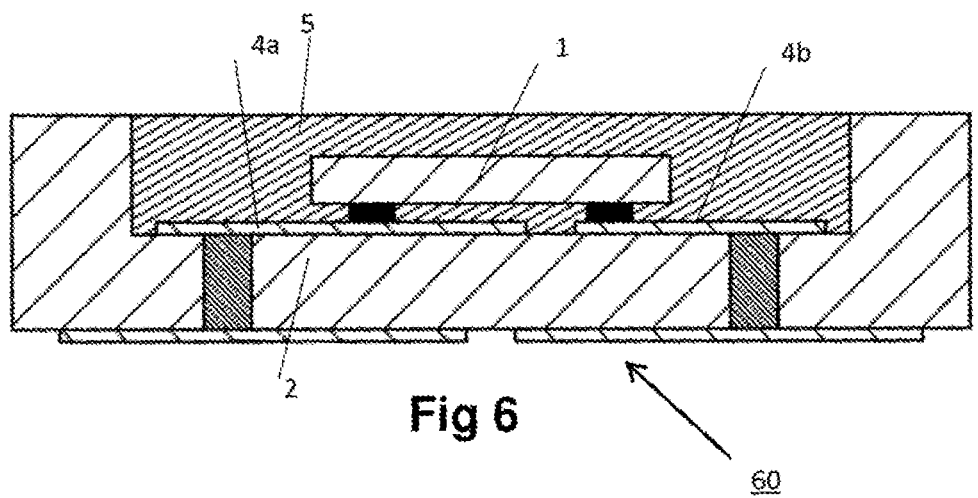
FIG. 6, show a schematic cross sectional view of a sixth embodiment according to the invention.

FIG. 6 shows a 'bathtub' assembly 60 similar to the previous one, wherein a cover 5 is provided and the mirror layers 4 are provided in corresponding recesses between the cover 5 and substrate 2 that liquefies when in use. In this example, advantageously, the mirror is solid when not in use.

Figure 7:
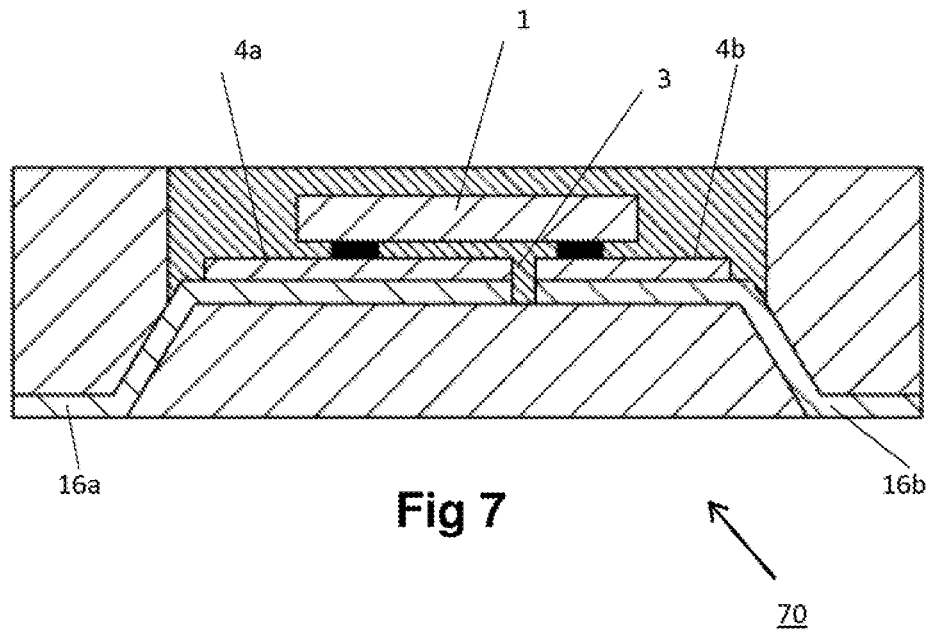
FIG. 7, show a schematic cross sectional view of a seventh embodiment according to the invention.

FIG. 7 shows a leadframe assembly 70 as an alternative for the wirebonding of FIG. 4. Here a central barrier 3 divides the mirror parts 4a, 4b.

Figure 8:
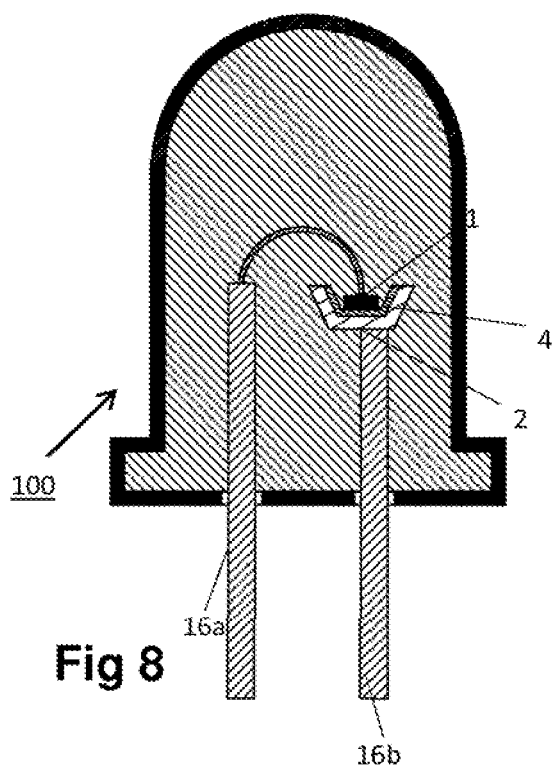
FIG. 8 shows a schematic cross sectional view of a eighth embodiment according to the invention.

FIG. 8 shows a low power design 100 e.g. of a 5 mm signal led type, having the chip provided in a recess 2 filled with liquid metal functioning as a mirror and electrode in connection with connector 16b. The upper part of the LED can be connected via wirebonding to connector 16a.

Figure 9A:
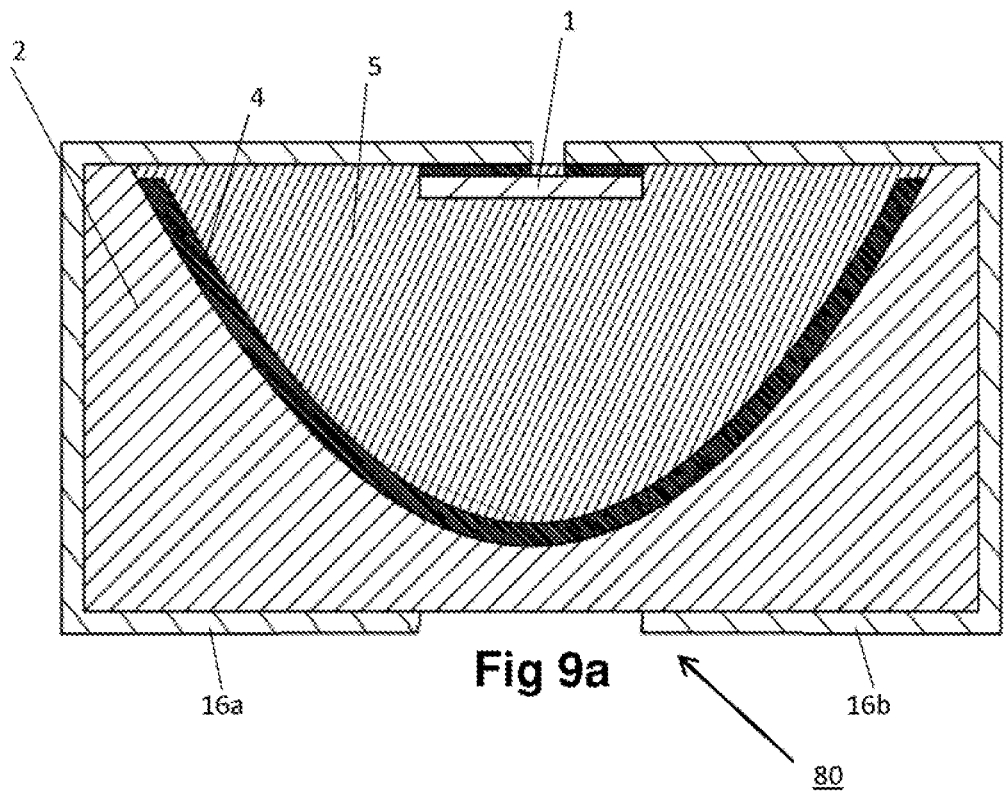
FIG. 9a, 9b shows a schematic cross sectional view of a ninth embodiment according to the invention.
Figure 9B:
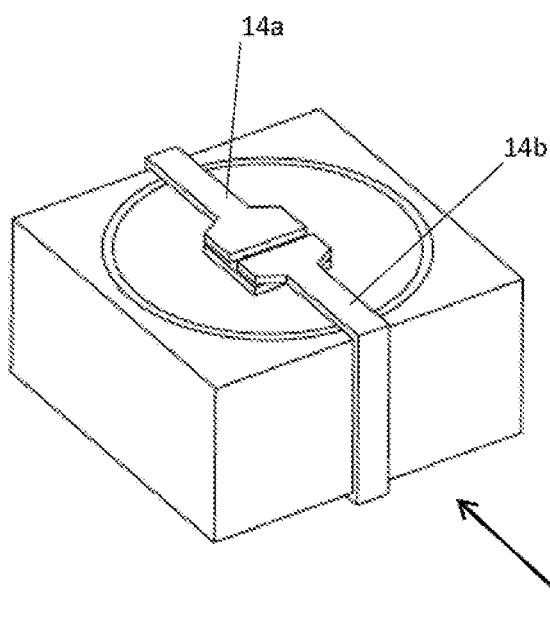

FIG. 9 shows a flipped assembly 80 (for indirect lighting or sensing). FIG. 9a shows a cross sectional view; FIG. 9b shows a corresponding perspective view. Reflector 4 is formed between substrate 2 and a transparent cover 5 and between die 1 and electrode 16a and 16b.

Figure 10:
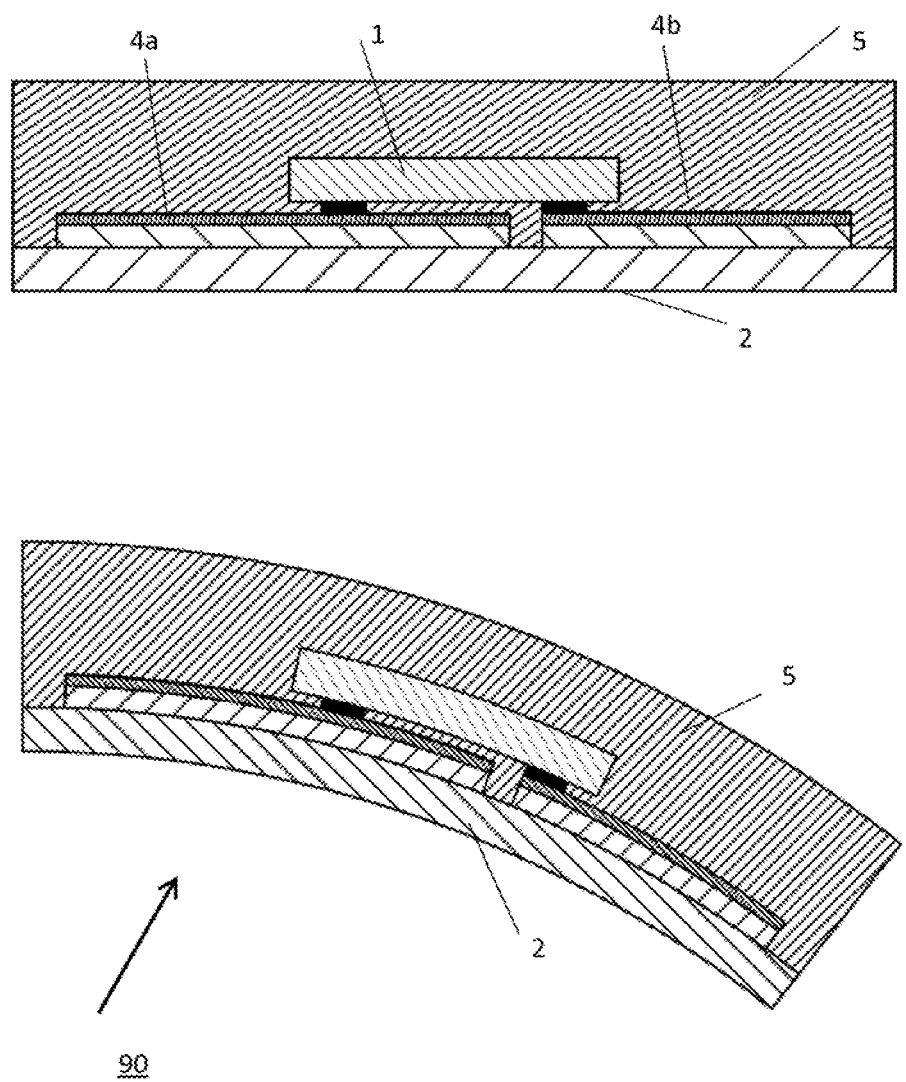
FIG. 10 shows a schematic cross sectional view of a tenth embodiment according to the invention.

FIG. 10 shows a further alternative embodiment. In FIG. 10, it is illustrated that the substrate 2 and a thin chip or OLED 1 can be of a flexible nature, i.e. can bend with a curvature, e.g. a flexible foil etc. The mirror parts 4a 4b can be provided in recesses on the foil 2, e.g. by a flexible transparent cover 5. Thus, in use, the reflector may be mouldable which can be used in an active way or passively. E.g. in an active way, i.e. by active control of the form, e.g. by actuating an adaptable mirror actuator optical reflection properties may be actively changed of the surface.

While the invention has been illustrated and described in detail in the drawings and foregoing description, such illustration and description are to be considered illustrative or exemplary and not restrictive; the invention is not limited to the disclosed embodiments. Furthermore, the skilled person will appreciate that the term test used herein is not limited to a specified physical designs, but may encompass all kinds of structures that may interconnect with the chip die. Furthermore, the invention is not limited to specific types of applications but may be used in (O)Led Lighting for; Automotive, headlights; Automotive, DRL (daytime running lights); Industrial lighting; Outdoor lighting; Residential lighting; Commercial/architectural lighting; Project-Table top & overhead; Automotive, rear combination lamp; Signaling; Automotive (Centre High Mount Stop Lamp); Automotive Interior; Flashlight; Desktop Monitors; Large displays, TV's; Projectors, pico and highly portable; Solar; Industrial (purposes e.g. (O)Ledbased lighting/illumination for processing purposes (e.g. curing).

Other variations to the disclosed embodiments can be understood and by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single unit may fulfill the functions of several items recited in the claims. The mere fact that certain measures are recited in mutually different dependent claims does not indicate that a combination of these measured cannot be used to advantage. For instance, the wetting properties described FIG. 3 can equally applied in other embodiments. Furthermore, while the metals described are formed of eutectic mixtures of Gallium and Indium, this does not exclude that other mixtures resulting in the same functionality could be applied. Clearly further additions to these mixtures do fall within the scope of the appended claims. in Any reference signs in the claims should not be construed as limiting the scope

The invention claimed is:

1. An electro-optical assembly comprising:
    at least one electro-optical element having electric terminals;
    a support for supporting said electro-optical element, said support comprising:
        a substrate,
        at least an electrode for electrical connection to the electric terminals of the electro-optical element, and
        a reflective member, said reflective member being disposed on a substrate surface relative to the electro-optical element, so as to reflect electromagnetic radiation to or from the electro-optical element via said reflective member when in use,
    the reflective member is formed of a metal that is in liquid state when in use,
    the reflective member is contained in a recess provided in or on the substrate surface having a transparent cover member covering said recess, the design of the recess being controlled by the geometry of the transparent cover member.

2. The electro-optical assembly of claim 1, wherein the reflective member is in electrical contact with the electrode and with said electric terminals.

3. The electro-optical assembly of claim 1, further comprising a barrier that electrically separates two or more recesses on the substrate surface containing said reflective member parts, the reflective member parts in corresponding electrical connection with two or more of electrodes.

4. The electro-optical assembly of claim 1, wherein the transparent cover member covers said recess and said electro-optical element.

5. The electro-optical assembly of claim 4, wherein said transparent cover member comprises optical conversion elements, such as phosphor, fillers or insulator.

6. The electro-optical assembly of claim 1, wherein the reflective member is formed of an eutectic mixture comprising Gallium and Indium.

7. The electro-optical assembly of claim 1, wherein the reflective member forms a meniscus having a form that is controlled by the wetting properties of the recess.

8. The electro-optical assembly of claim 1, wherein said substrate is flexible.

9. The electro-optical assembly of claim 1, wherein the reflective member is in solid state when not in use.

10. The electro-optical assembly of claim 1, wherein said electrode is disposed on an upper surface of the substrate facing the bottom of said electro-optical element.

11. The electro-optical assembly claim 1, wherein said electrode traverses said substrate through a via structure.

12. The electro-optical assembly of claim 1, wherein said electric terminals of said electro-optical element are facing said reflective member.

13. The electro-optical assembly of claim 1, wherein said support is a luminaire and said electro-optical element is directly supported by said luminaire.

14. The electro-optical assembly of claim 1, wherein said electro-optical element is a LED die or an OLED.

15. A process for manufacturing an electro-optical assembly, the process comprising:

providing a support including a substrate and an electro-optical element having one or more electric terminals;

providing an electrode on said substrate for electrical connection to one of said terminals of the electro-optical element;

disposing a reflective member on a substrate surface in a recess provided in or on the substrate surface;

placing the electro-optical element relative to the reflective member so as to reflect electromagnetic radiation to or from the electro-optical element via said reflective member when in use; wherein the reflective member is formed of a metal that is in liquid state when in use; and providing a transparent cover member covering said recess, the design of the recess being controlled by the geometry of the transparent cover member, said recess containing the reflective member.

* * * * *